(12) United States Patent
Tanaka et al.

(10) Patent No.: US 7,732,847 B2
(45) Date of Patent: Jun. 8, 2010

(54) SEMICONDUCTOR MEMORY DEVICE INCLUDING A SEMICONDUCTOR FILM MADE OF A MATERIAL HAVING A SPONTANEOUS POLARIZATION AND METHOD FOR FABRICATING THE SAME

(75) Inventors: Hiroyuki Tanaka, Kyoto (JP); Yukihiro Kaneko, Osaka (JP); Yoshihisa Kato, Shiga (JP)

(73) Assignee: Panasonic Corporation, Osaka (JP)

( * ) Notice: Subject to any disclaimer, the term of this patent is extended or adjusted under 35 U.S.C. 154(b) by 142 days.

(21) Appl. No.: 12/033,481

(22) Filed: Feb. 19, 2008

(65) Prior Publication Data

US 2008/0251816 A1 Oct. 16, 2008

(30) Foreign Application Priority Data

Apr. 16, 2007 (JP) ............................. 2007-107088

(51) Int. Cl.
*H01L 31/113* (2006.01)
(52) U.S. Cl. .............................. 257/295; 257/E21.208; 438/3
(58) Field of Classification Search .................. 438/3; 257/255, 295, E21.208
See application file for complete search history.

(56) References Cited

U.S. PATENT DOCUMENTS

| | | | | |
|---|---|---|---|---|
| 4,707,631 A | * | 11/1987 | Stokes et al. | 310/313 A |
| 6,329,741 B1 | * | 12/2001 | Vartuli et al. | 310/363 |
| 6,396,094 B1 | * | 5/2002 | Mirkarimi et al. | 257/295 |
| 6,821,340 B2 | * | 11/2004 | Nagasawa et al. | 117/84 |
| 7,145,174 B2 | * | 12/2006 | Chiang et al. | 257/59 |

FOREIGN PATENT DOCUMENTS

JP 10041477 A * 2/1998
JP 2006-121029 5/2006

OTHER PUBLICATIONS

Prins, M.W.J., et al., "A ferroelectric transparent thin-film transistor", Appl. Phys. Lett., Jun. 1996, pp. 3650-3652, vol. 68 (25), American Institute of Physics.
Miyasako, T., et al., "Ferroelectric-gate thin-film transistors using indium-tin-oxide channel with large charge controllability", Applied Physics Letters, Apr. 2005, 86, 162902-1-162902-3, American Institute of Physics.
Yoshimura, T., et al., "Novel Ferroelectric Gate Thin-Film Transistors Using a Polar Semiconductor Channel", Japanese Journal of Applied Physics, 2006, vol. 45, No. 48, pp. L1266-L1269, The Japan Society of Applied Physics.

* cited by examiner

*Primary Examiner*—Thao X Le
*Assistant Examiner*—Tanika Warrior
(74) *Attorney, Agent, or Firm*—McDermott Will & Emery LLP

(57) ABSTRACT

A semiconductor memory device is composed of a field effect transistor using the interface between a ferroelectric film and a semiconductor film as the channel and including a gate electrode to which a voltage for controlling the polarization state of the ferroelectric film is applied and source/drain electrodes provided on both ends of the channel to detect a current flowing in the channel in accordance with the polarization state. The semiconductor film is made of a material having a spontaneous polarization and the direction of the spontaneous polarization is parallel with the interface between the ferroelectric film and the semiconductor film.

14 Claims, 14 Drawing Sheets

FIG. 7A
FIG. 7B
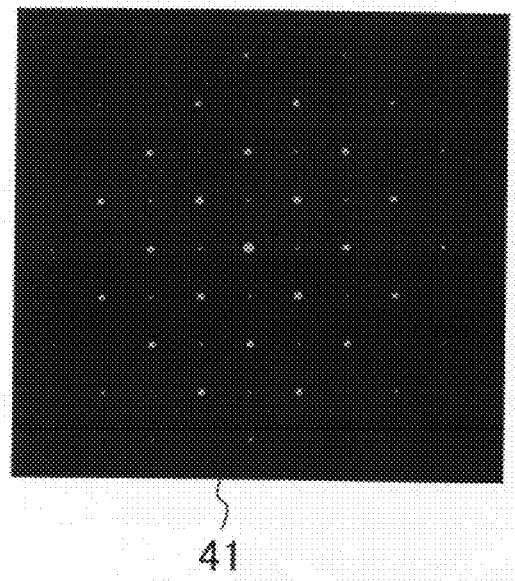
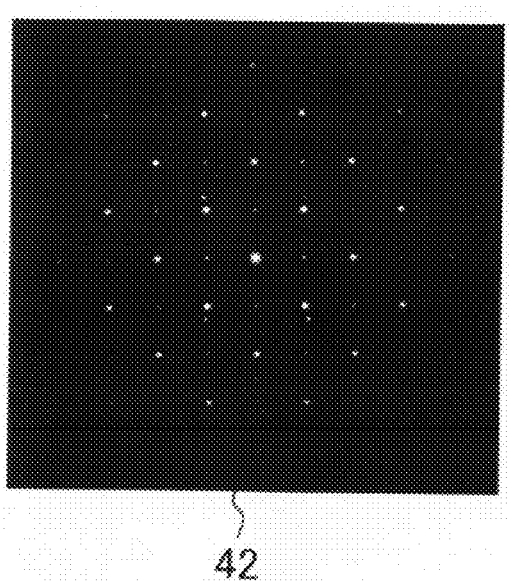
41
42
FIG. 7C
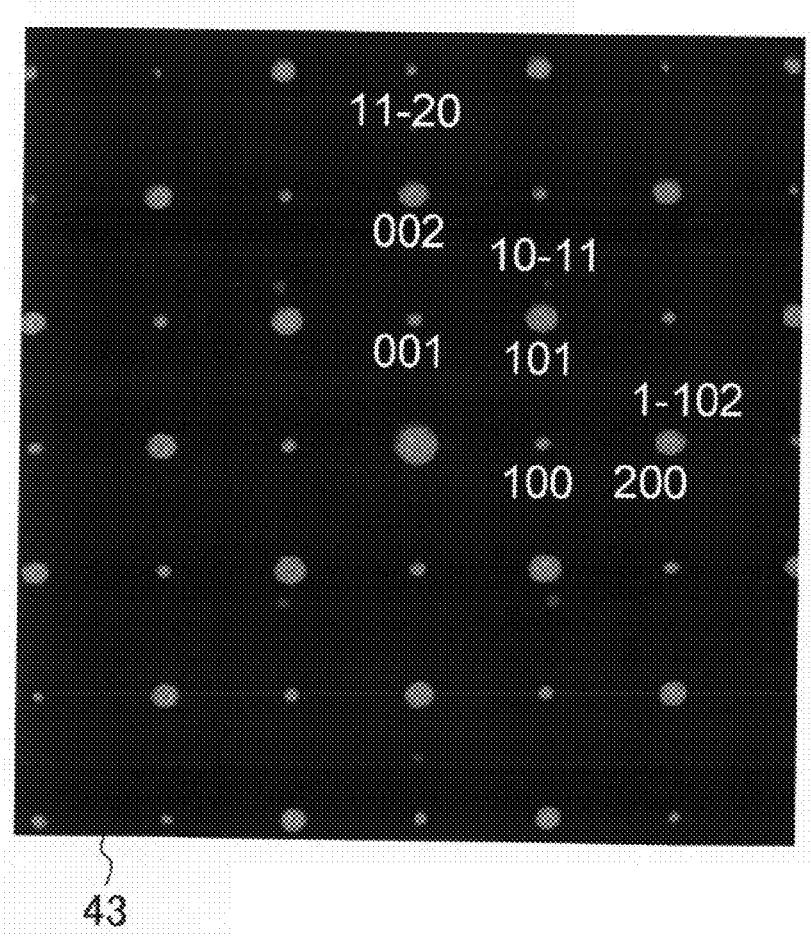
43

SEMICONDUCTOR MEMORY DEVICE INCLUDING A SEMICONDUCTOR FILM MADE OF A MATERIAL HAVING A SPONTANEOUS POLARIZATION AND METHOD FOR FABRICATING THE SAME

BACKGROUND OF THE INVENTION

The present invention relates to a semiconductor memory device comprising a field effect transistor having a gate insulating film composed of a ferroelectric film.

Nonvolatile memories, each using a ferroelectric material, are roughly divided into two types which are a capacitor type and a FET (Field Effect Transistor) type having a gate insulating film composed of a ferroelectric film.

The capacitor type has a structure similar to that of a DRAM (Dynamic Random Access Memory), holds charges in a ferroelectric capacitor, and distinguishes between the "0" and "1" sates of information in accordance with the polarization direction of the ferroelectric material. In the reading of the information, the stored information is destroyed so that an operation of rewriting the information is needed. As a result, each reading operation causes polarization reversal so that polarization reversal fatigue presents a problem. In addition, because polarization charges are read using a sense amplifier in the structure, an amount of charges of not less than the sensing limit (which is typically 100 fC) of the sense amplifier is necessary. Since the polarization charges per unit area of a ferroelectric material are intrinsic to the material, even when a memory cell is miniaturized, an electrode area of a given size is needed as long as the same material is used. Therefore, it is difficult to reduce the size of the capacitor in direct proportion to the miniaturization of process rules, so that the capacitor-type ferroelectric memory is unsuitable for an in crease in capacity.

By contrast, from the FET-type ferroelectric memory, information is read by detecting the conductive state of the channel which changes in accordance with the polarization orientation of the ferroelectric film. This allows non-destructive reading of the information as well as an increase in the amplitude of an output voltage through the amplifying operation of the FET. As a result, compared with the capacitor-type ferroelectric memory, the FET-type ferroelectric memory can be extremely miniaturized in dependence on the scaling law.

There has conventionally been proposed a FET-type transistor in which a ferroelectric film, serving as a gate insulating film, is formed on a silicon substrate serving as the channel. Such a structure is termed a MFS (Metal-Ferroelectric-Semiconductor) FET. However, in contrast to the capacitor-type ferroelectric memory capable of retaining data for about 10 years, data disappears from the conventional MFSFET in about several days. This is conceivably because an excellent interface is not formed between the silicon substrate and the ferroelectric film. In other words, because the ferroelectric film is formed on the silicon substrate at a high temperature, the oxidation of the surface of the silicon substrate and the diffusion of an element into silicon easily occur to prevent the formation of the excellent interface.

To solve the problem, a ferroelectric memory composed of a MFSFET using an oxide semiconductor for a semiconductor layer has been proposed (see Applied Physics Letters Vol. 68, pp. 3650-3652, Jun. 17 (1996) and Applied Physics Letters Vol. 86, pp. 162902-1 to 162902-3, April (2005)). In general, considering that a ferroelectric film is made of an oxide, an oxide layer made of an oxide such as silicon dioxide is not formed in a multilayer structure using an oxide semiconductor for a channel, in contrast to a multilayer structure using silicon for a channel. Accordingly, it can be expected to provide a stable interface state.

FIGS. 14A and 14B are cross-sectional views each showing a typical structure of a MFSFET using an oxide semiconductor for the channel, of which FIG. 14A shows a structure of a back-gate MFSFET in which a gate electrode 102 is formed below a channel (oxide semiconductor film) 104 and FIG. 14B shows a structure of a top-gate MFSFET in which the gate electrode 102 is formed above the channel 104. In the drawings, 101 denotes a substrate, 103 denotes a ferroelectric film, and 105 denotes source/drain electrodes.

To keep up with the miniaturization of a semiconductor integrated circuit with an embedded memory, a structure in which a ferroelectric memory is stacked on a CMOS formed with a selection transistor is desired. In that case, a back-gate structure in which a gate electrode is disposed below a channel, as shown in FIG. 14A, is preferred to a top-gate structure in which a gate electrode is disposed above a channel, as shown in FIG. 14B. This is because, when the back-gate structure is adopted, a region for contact with the CMOS can be reduced and the area of each of memory cells can be reduced. In addition, because the ferroelectric film 103 and the oxide semiconductor film 104 can be formed continuously as a multilayer film in the back-gate structure, the achievement of a more stable interface state can be expected.

For the oxide semiconductor film 104, Non-Patent document 1 uses tin oxide ($SnO_2$) and Non-Patent Document 2 uses indium tin oxide (ITO). In the case of using $SnO_2$, an On/Off ratio of 60 is obtained. In the case of using ITO, an On/Off ratio of $10^4$ is obtained. However, in either case, a long-term data retention characteristic has not been obtained.

Because zinc oxide (ZnO) has an electron mobility higher than that of another oxide semiconductor, when ZnO is used for the channel of a MFSFET, a large on-current is obtained to increase the On/Off ratio. Accordingly, the enlargement of the read margin of a memory can be expected. However, in an actual situation, even when a ZnO film was used for a channel, the obtained On/Off ratio was only about 90 and the obtained retention time was only not more than $10^4$ seconds (Japanese Journal of Applied Physics, Vol. 48, pp. L1266-L1269, December (2006).

SUMMARY OF THE INVENTION

As described above, even when ZnO having a high electron mobility is used as an oxide semiconductor, the obtained On/Off ratio is not so large and the retention time thereof is also short. As a result of conducting a dedicated study on the cause thereof, the prevent inventors have noticed the following problem resulting from a characteristic specific to ZnO.

That is, because ZnO is a polar semiconductor having a wurtzite-type crystal structure and has a spontaneous polarization (about 5 $\mu C/cm^2$) in the c-axis direction (<0001> direction) of the crystal thereof, uneven charge distribution occurs in the crystal. As a result, as shown in FIG. 15, a (0001) surface perpendicular to the c-axis, i.e., a C surface (a surface terminated with an oxygen surface is termed a −C surface and a surface terminated with a zinc surface is termed a +C surface) becomes a polar surface so that a spontaneous polarization oriented in a direction perpendicular to the −C surface is formed.

On the other hand, in the MFSFET with a back-gate structure shown in FIG. 14A, the oxide semiconductor film 104 is formed by epitaxial growth on the ferroelectric film 103. The ferroelectric film 103 represented by lead zirconium titanate ($Pb(Zr_{1-x}Ti_x)O_3$ where $0 \leq x \leq 1$ is satisfied or PZT) is typically formed on the electrode 102 made of platinum (Pt), iridium, or strontium ruthenate (SrRuO₃ or SRO) and having a (111) orientation that can be controlled easily. When the PZT film 103 is grown on the electrode 102 made of any of the materials shown above, the PZT film 103 having the (111) orientation is easily obtainable. When the ZnO film 104 is epitaxially grown on the PZT film 103 having the (111) orientation, the ZnO film 104 having a (0002) orientation (c-axis orientation) is obtained, as shown by the X-ray diffraction of FIG. 16. A conceived reason for this may be that, because the atomic arrangement in the (111) surface of the PZT film 103 has an equilateral triangular period, the ZnO film 104 is also likely to have the (0002) orientation in which the atomic arrangement also has an equilateral triangular period. When the ZnO film 104 having the c-axis orientation is formed on the oxide substrate, the ZnO 104 film having the −C surface on the film surface side is normally formed. As a result, the spontaneous polarization oriented toward the surface side of the ZnO film 104 is formed.

When the polarization thus oriented is formed, uneven charge distribution occurs in the ZnO film 104 so that electrons are reduced at the interface with the ferroelectric film 103. That is, due to the polarization of the ferroelectric film 103, the spontaneous polarization of the ZnO film 104 acts in a direction which reduces charges (electrons) localized in the vicinity of the interface when the electrons are induced at the interface between the ferroelectric film 103 and the semiconductor film 104 (On state). As a result, it is considered that the on-current decreases and the retention time decreases.

The present invention has been achieved in view of the foregoing finding and a primary object thereof is to provide a semiconductor memory device comprising a MFSFET having a large On/Off ratio and an improved retention characteristic by reducing the influence of the spontaneous polarization of a semiconductor film.

To attain the object, the semiconductor memory device according to the present invention adopts a structure using a semiconductor film having a non-polar surface orientation for the channel of a field effect transistor using the interface between a ferroelectric film and the semiconductor film as the channel.

Specifically, a semiconductor memory device according to the present invention comprises a field effect transistor using an interface between a ferroelectric film and a semiconductor film as a channel, wherein the field effect transistor comprises: a gate electrode to which a voltage for controlling a polarization state of the ferroelectric film is applied; and source/drain electrodes provided on both ends of the channel to detect a current flowing in the channel in accordance with the polarization state, wherein the semiconductor film is made of a material having a spontaneous polarization and a direction of the spontaneous polarization is parallel with the interface between the ferroelectric film and the semiconductor film.

In such a structure, the spontaneous polarization of the semiconductor film is oriented in a direction perpendicular to a surface of the ferroelectric film. As a result, it is possible to suppress a reduction in the polarization of the ferroelectric film due to the spontaneous polarization and thereby obtain the semiconductor memory device comprising a MFSFET having a large On/Off ratio and an improved retention characteristic.

In a preferred embodiment, the semiconductor film is formed on the ferroelectric film by epitaxial growth and the direction of the spontaneous polarization is controlled by a crystal orientation of the ferroelectric film.

With such a structure, it is possible to easily control the direction of spontaneous polarization of the semiconductor film and bring the interface between the ferroelectric film and the semiconductor film into an excellent state. As a result, the semiconductor memory device with a further improved retention characteristic can be obtained.

BRIEF DESCRIPTION OF THE DRAWINGS

FIGS. 2A to 2D are views each showing the relationship between the direction of spontaneous polarization of a semiconductor film and a channel state in the present invention, of which FIGS. 2A and 2B are views each showing the case where a polar surface orientation is provided and FIGS. 2C and 2D are views each showing the case where a non-polar surface orientation is provided;

FIGS. 7A to 7C are views each showing a transmission electron diffraction pattern obtained from the semiconductor memory device according to the first embodiment;

FIGS. 10A and 10B are views each showing a write operation to the semiconductor memory device according to the first embodiment, of which FIG. 10A is a view showing a depletion state and FIG. 10B is a view showing an accumulation state;

FIGS. 14A and 14B are views showing respective structures of conventional MFSFET ferroelectric memories, of which FIG. 14A is a cross-sectional view of a back-gate structure and FIG. 14B is a cross-sectional view of a top-gate structure;

DETAILED DESCRIPTION OF THE PREFERRED EMBODIMENTS

Figure 1:
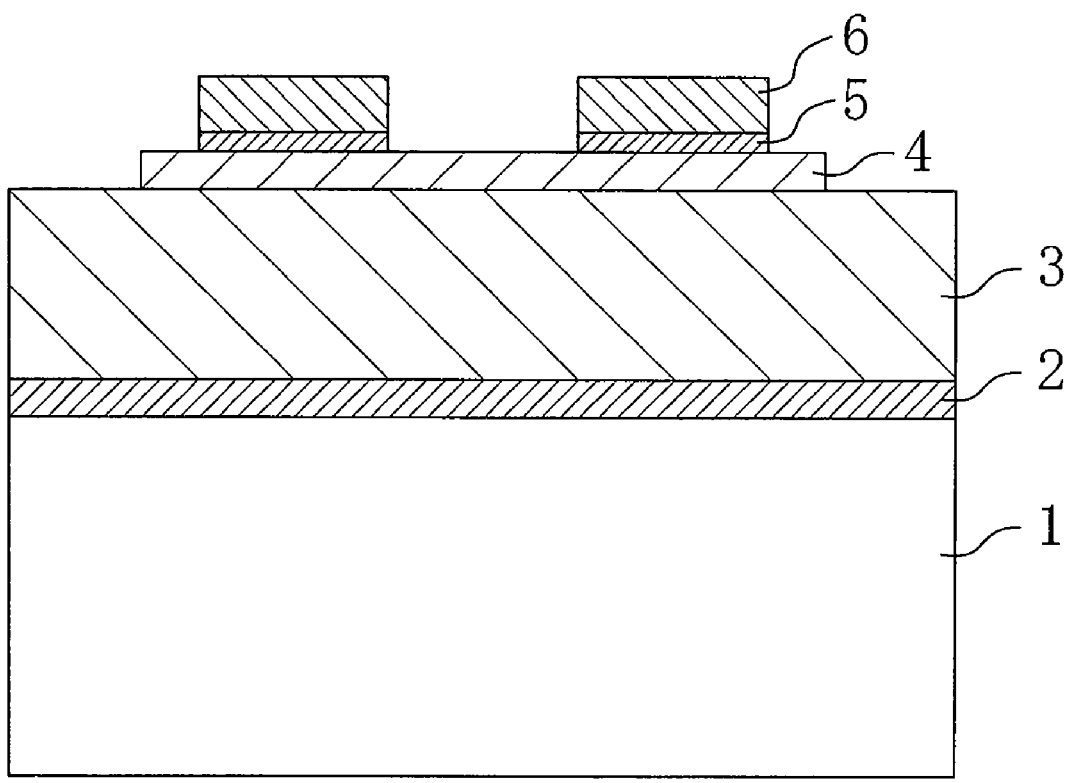
FIGS. 1 is a cross-sectional view showing a structure of a semiconductor memory device according a first embodiment of the present invention.

Referring to the drawings, the embodiments of the present invention will be described hereinbelow. Throughout the drawings shown below, components having substantially the same functions will be denoted by the same reference numerals for the sake of simple illustration. It is to be noted that the present invention is not limited to the following embodiments.

Embodiment 1

FIG. 1 is a cross-sectional view schematically showing a structure of a semiconductor memory device according to the first embodiment of the present invention.

As shown in FIG. 1, the semiconductor memory device according to the present embodiment is composed of a field effect transistor using the interface between a ferroelectric film 3 and a semiconductor film 4 as a channel and comprising a gate electrode 2 to which a voltage for controlling the polarization state of the ferroelectric film 3 is applied and source/drain electrodes 5 and 6 for detecting a current flowing in the channel in accordance with the polarization state. The semiconductor film 4 is made of a material having a spontaneous polarization, in which the direction of the spontaneous polarization is parallel with the interface between the ferroelectric film 3 and the semiconductor film 4.

In the present embodiment, the semiconductor film 4 is composed of a ZnO film having a wurtzite-type crystal structure. The crystal orientation of the semiconductor film 4 is controlled such that the <11-20> direction or <1-100> direction thereof is perpendicular to the principal surface of the semiconductor film 4. As a result, the direction of spontaneous polarization of the semiconductor film 4 is parallel with the interface between the ferroelectric film 3 and the semiconductor film 4, and therefore a reduction in the polarization of the ferroelectric film 3 due to the spontaneous polarization can be suppressed.

Figure 2A:
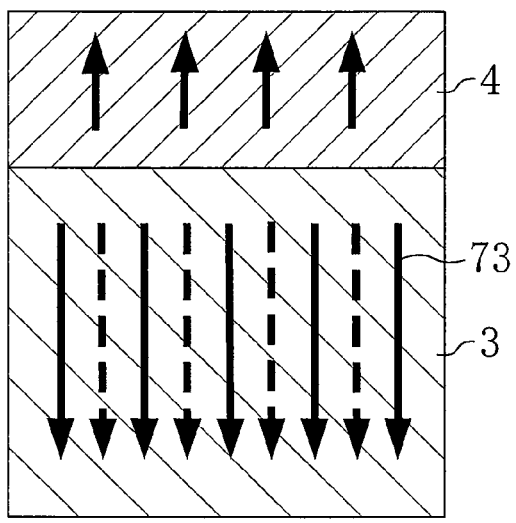
Figure 2C:
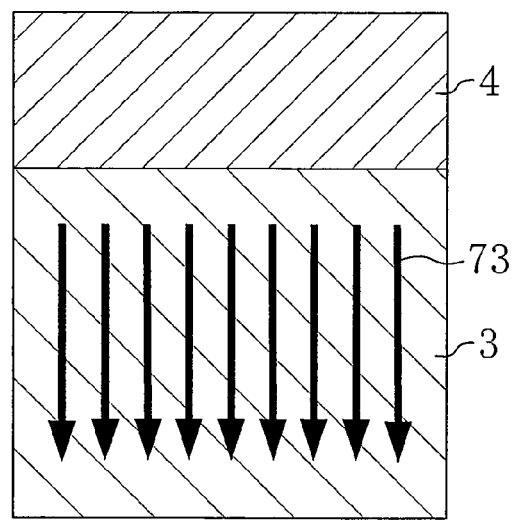
Figure 2B:
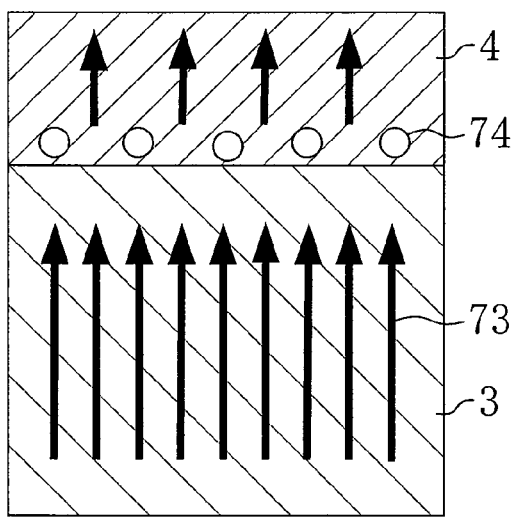
Figure 2D:
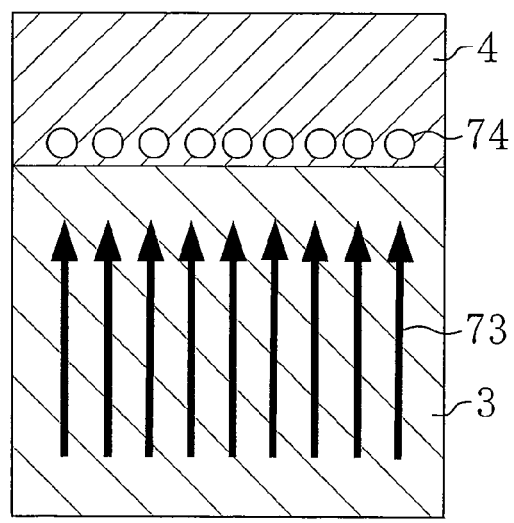

That is, as shown in FIGS. 2A and 2B, when the direction of spontaneous polarization of the semiconductor film 4 is the same as the direction of polarization 73 of the ferroelectric film 3 (polar surface orientation), the polarization 73 of the ferroelectric film 3 attenuates in a depletion state shown in FIG. 2A, while electrons 74 as accumulated charges disappear in an accumulation state shown in FIG. 2B. By contrast, when the direction of spontaneous polarization of the semiconductor film 4 is parallel with the interface between the ferroelectric film 3 and the semiconductor film 4 (non-polar surface orientation), the polarization 73 of the ferroelectric film 3 does not attenuate even in the depletion state shown in FIG. 2C, and the electrons 74 as the accumulated charges are held even in the accumulation state shown in FIG. 2D.

Next, a description will be given to a specific structure of the semiconductor memory device according to the present embodiment with reference to step cross-sectional views shown in FIGS. 3A to 3D.

Figure 3A:
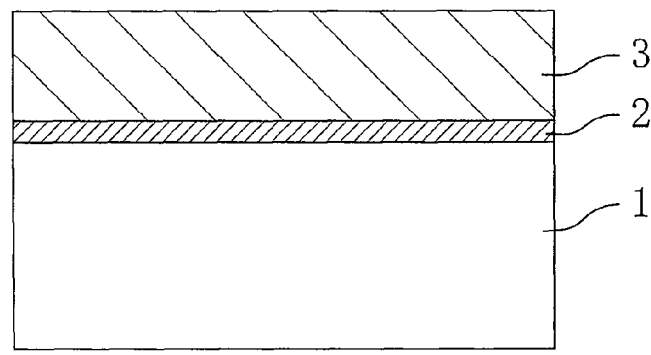
FIGS. 3A to 3D are cross-sectional views illustrating a method for fabricating the semiconductor memory device according to the first embodiment.

First, as shown in FIG. 3A, the gate electrode 2 made of strontium ruthenate ($SrRuO_3$ or SRO) having a thickness of about 30 nm is formed by a PLD (Pulse Laser Deposition) method on a substrate 1 made of strontium titanate ($SrTiO_3$ or STO) cut out to have a (100) surface in a state where the substrate temperature is set at 700° C. Further, an annealing process is performed with respect to the SRO film 2 in an oxygen atmosphere at 700° C. and 1 atmospheric pressure in an oven. Then, the ferroelectric film 3 made of PZT having a thickness of about 450 nm is formed by a PLD method on the SRO film 2 at a substrate temperature of 700° C.

Figure 4A:
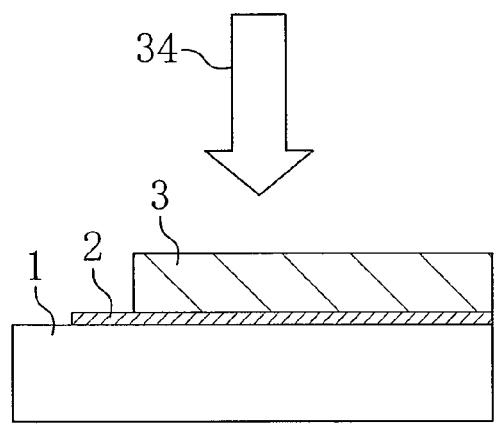
FIG. 4A is view showing the result of measurement by electron back scattering diffraction in the semiconductor memory device according to the first embodiment and FIGS. 4B to 4D are views showing the respective diffraction patterns of a STO substrate, a SRO film, and a PZT film.
Figure 4B:
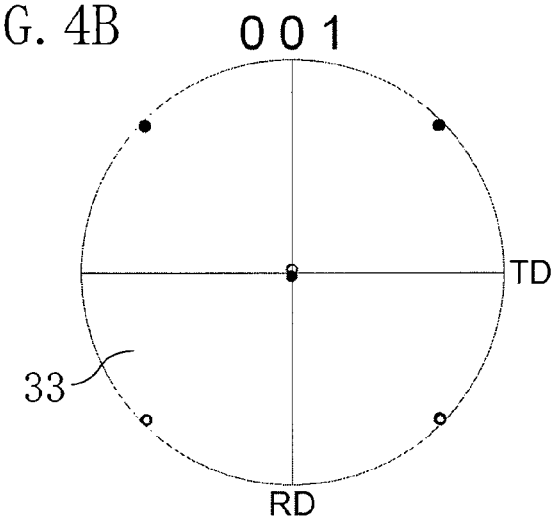
Figure 4C:
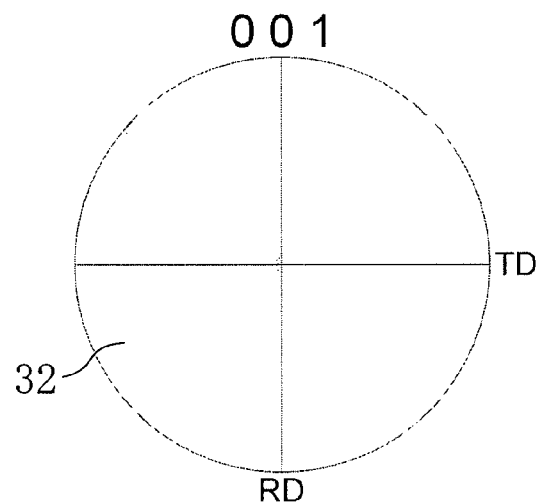
Figure 4D:
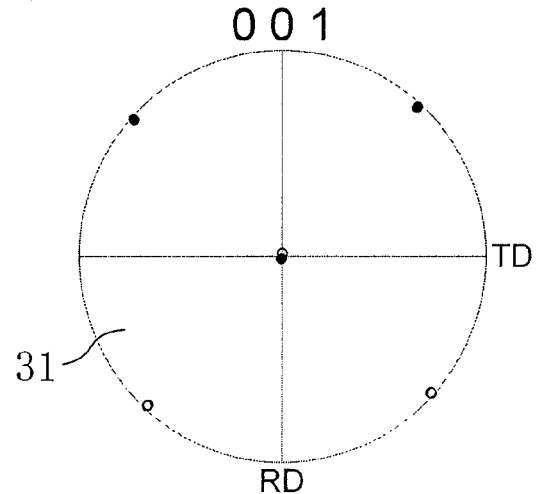

The composition of a sintered body having a composition ratio of Pb:Zr:Ti=1:0.52:0.48 is used as the target of PLD. In the PZT film 3 having the composition, a tetragonal phase and a rhombohedral phase normally coexist. However, since the present embodiment uses the cubic-system STO substrate 1 and the peak of the tetragonal phase cannot be separated from that of the rhombohedral phase, it can be conceived that the PZT film 3 is composed of the tetragonal phase and oriented in the <001> direction. Further, as shown in FIG. 4A, the respective in-plane crystal orientations of the STO substrate 1, the SRO film 2, and the PZT film 3 were observed by an electron back scattering diffraction (EBSD) method. As a result, 4-fold symmetrical pole figures (corresponding to 31, 32, and 33 of FIGS. 4B to 4D) each having orientations in an equal direction in a plane were obtained. From this, it will be understood that the PZT film 3 is an excellent epitaxial film.

Figure 3B:
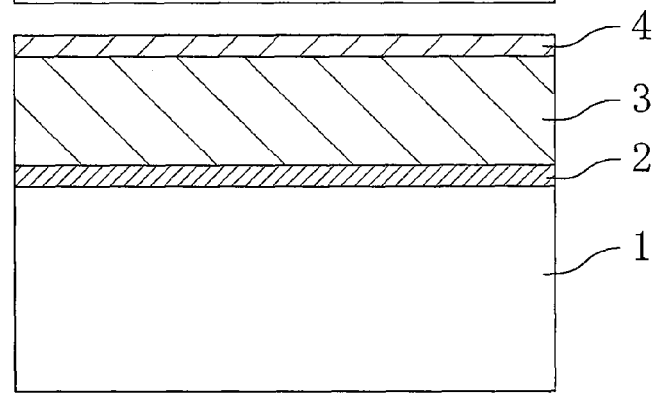

Next, as shown in FIG. 3B, the semiconductor film 4 made of n-type ZnO having a thickness of about 30 nm is formed in the state where the substrate temperature is set at 400° C. in the same chamber of a PLD system. When it is assumed herein that the thickness of the semiconductor film 4 is not more than 60 nm (more preferably, not more than 30 nm), it is possible to form the semiconductor film 4 without degrading the crystallinity thereof. Accordingly, the carrier concentration can be adjusted to be not more than $1 \times 10^{17}$ cm$^{-3}$ (not more than $1 \times 10^{16}$ cm$^{-3}$). Since a film which is extremely low in carrier concentration for the semiconductor film 4 can be thus obtained, an intrinsically high resistance value is obtainable. As a result, when the transistor is operated, an off-current can be reduced, and therefore the achievement of a high On/Off ratio can be expected.

Figure 5:
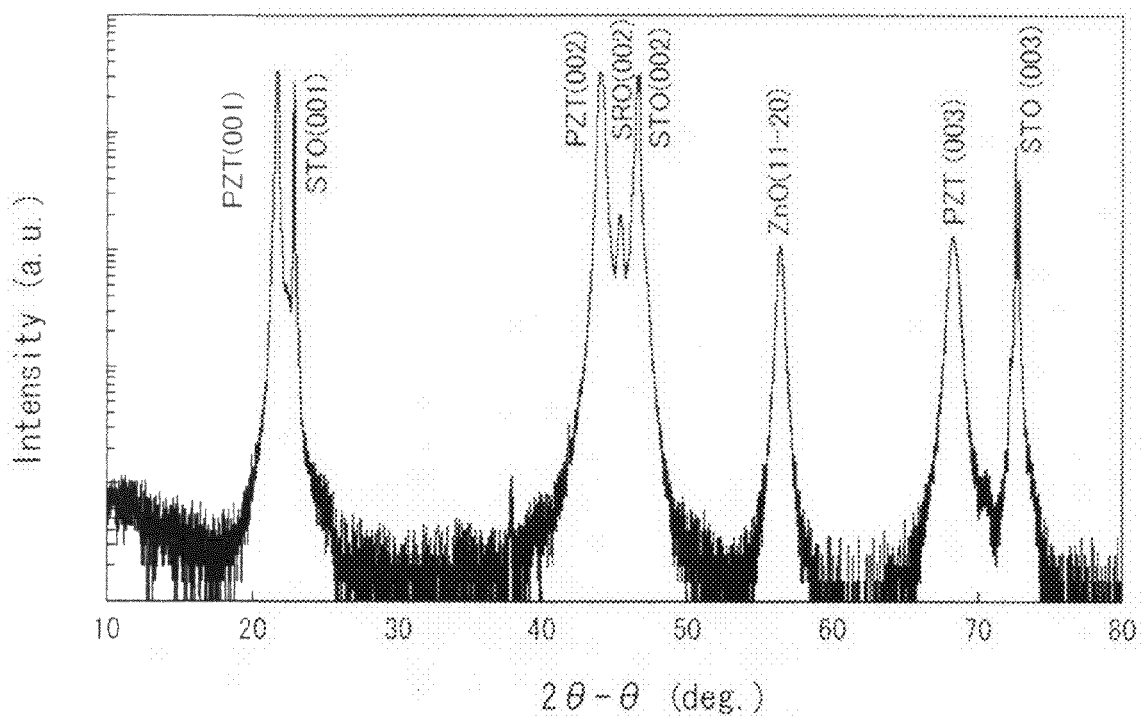
FIG. 5 is a view showing an X-ray diffraction pattern obtained from the semiconductor memory device according to the first embodiment.
Figure 6:
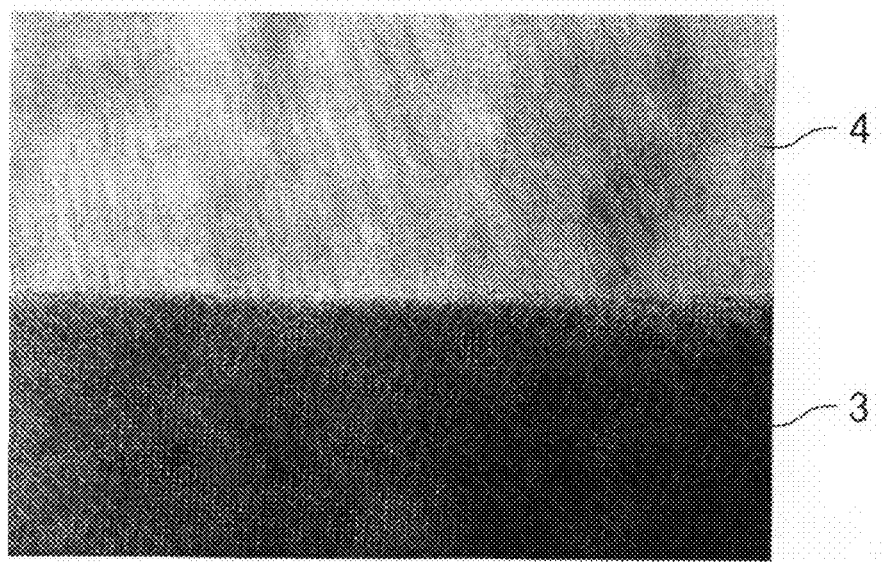
FIG. 6 shows a cross-sectional transmission electron microscope image obtained from the semiconductor memory device according to the first embodiment.

By observing the crystal orientation by an X-ray diffraction method, it can be seen that the ZnO film 4 formed by the foregoing method is oriented in the <11-20> direction under the influence of the orientation of the (0001) surface of the PZT film 3, as shown in FIG. 5. The crystal orientation is tilted by 90 degrees from the c-axis direction (<0001> direction) having a polarity, which indicates that a non-polar surface orientation is provided. Further, as a result of observing the cross-sectional structure using a cross-section transmission electron microscope (cross-section TEM), the interface had no disturbance, as shown in FIG. 6. From this, it will be understood that the crystal lattice of the PZT film 3 matches that of the ZnO film 4.

Moreover, in a diffraction image 43 (FIG. 7C) obtained by synthesizing the respective transmission electron diffraction images of the PZT region 41 and the ZnO/PZT region 42, the <100> direction of the PZT film 3 and the <1-102> direction of the ZnO film 4 are equally oriented. From this, it will be understood that the ZnO film 4 has epitaxially grown with respect to the PZT film 3.

Figure 3C:
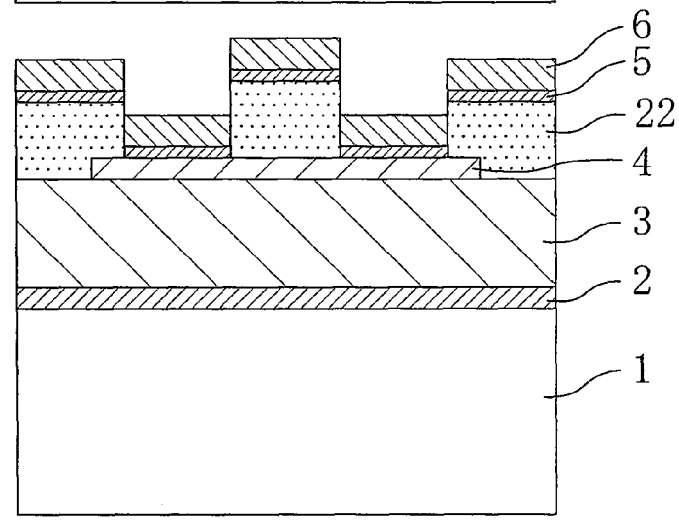

Next, as shown in FIG. 3C, the ZnO film 4 is removed by etching except for the portions thereof located in isolation regions. Then, a resist film 22 is patterned to form a Ti film 5 having a thickness of about 30 nm and a Pt film 6 having a thickness of about 60 nm on the substrate 1 by an electron beam vapor deposition method.

Figure 3D:
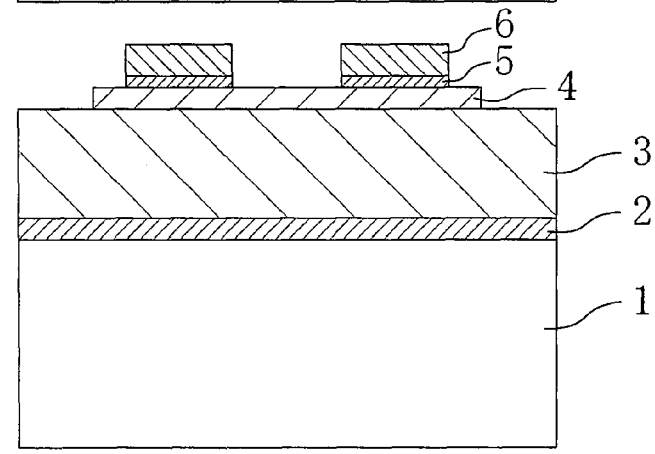

Finally, as shown in FIG. 3D, the source/drain electrodes each composed of a multilayer film consisting of the Ti film 5 and the Pt film 6 are formed on the ZnO film 4 by removing the resist film 22, so that the semiconductor memory device shown in FIG. 1 is completed.

According to the present embodiment, by controlling the crystal orientation of the ferroelectric film 3, the <11-20> direction or <1-100> direction of the semiconductor film 4 epitaxially grown thereon can be controlled to be perpendicular to the principal surface of the semiconductor film 4. As a result, it is possible to easily control the spontaneous polarization direction of the semiconductor film 4 and suppress a reduction in the polarization of the ferroelectric film 3 due to spontaneous polarization.

In addition, since the semiconductor film 4 is epitaxially grown with respect to the ferroelectric film 3, there is no grain boundary in the semiconductor film 4. As a result, the scattering of carriers by grain boundaries is suppressed, and the on-current can be increased. This increases the On/Off ratio and allows the enlargement of the read margin of the memory.

The temperature at which the ZnO film 4 is formed is typically in the range of 400 to 1,000° C., while the temperature at which the PZT film 3 is formed is typically in the range of 500 to 700° C. Therefore, by selecting formation temperatures, it is possible to obtain the ferroelectric film 3 and the semiconductor film 4 having an excellent interface therebetween and each having an excellent crystallinity.

By controlling the <001> direction when the PZT film 3 is composed of a tetragonal phase or controlling the <100> direction when the PZT film 3 is composed of a rhombohedral phase such that the controlled direction is perpendicular to the substrate 1, the polarization direction of the PZT film is oriented perpendicular to the film surface, and the difference in remnant polarization of the ferroelectric film 3 can be increased to a large value of about $2Pr=40$ to $70\ \mu C/cm^2$. As a result, a large number of charges (e.g., about a surface charge density of $2\times10^{14}\ cm^{-2}$) can be induced, and an increase in on-current can be expected.

When the <11-20> direction of the ZnO film 4 having a wurtzite-type structure is perpendicular to the substrate, not only the ZnO film 4 has a non-polar surface orientation, but also the lattice matching property with the PZT film 3 is improved. This allows a reduction in surface states, and therefore an increase in on-current.

Preferably, the <100> direction in a plane of the tetragonal PZT film 3 generally coincides with the <1-102> direction in a plane of the ZnO film 4. Alternatively, the <001> direction in a plane of the rhombohedral PZT film 3 generally coincides with the <1-102> direction in a plane of the ZnO film 4. This provides the in-plane crystal orientations in equal directions and can reduce the surface states. Because of the resulting epitaxial growth, there is no grain boundary. As a result, it is possible to suppress scattering by grain boundaries and therefore increase the on-current.

As the PZT film 3, a PZT film doped with an element such as lanthanum (La), niobium (Nb), vanadium (V), tungsten (W), praseodymium (Pr), or samarium (Sm) may also be used. By doping the PZT film 3 with another element, the crystallization temperature can be reduced. This allows low-temperature formation and also achieves the effect of reducing repeated polarization reversal fatigue. As the ZnO film 4, a ZnO film doped with another element such as magnesium (Mg), gallium (Ga), or aluminum (Al) may also be used. This allows free control of the carrier concentration as well as control of a switching state. As the semiconductor film 4, a film made of gallium nitride (GaN), indium nitride (InN), or a mixed crystal thereof may also be used instead of the ZnO film. As the method for depositing the SRO film 2, the PZT film 3, and the ZnO film 4, a metal organic chemical vapor deposition (MOCVD) method, a sputtering method, a molecular beam epitaxial (MBE) method, or the like may also be used instead of the PLD method.

A multilayer electrode consisting of the Ti film 5 and the Pt film 6 was formed directly on the PZT film 3 formed by the fabrication method according to the present embodiment and the polarization characteristic of the PZT film 3 was examined. As a result, the difference in remanent polarization value obtained by applying voltages of ±10 V to the SRO film 2 and between the electrodes was 59 $\mu C/cm^2$. Since the crystal orientation in the thickness direction of the PZT film 3 is in the <001> direction, which is the polarization direction, a large remanent polarization value has been obtained.

Next, a description will be given to the subthreshold characteristic of the semiconductor memory device according to the present embodiment with reference to FIGS. 8 and 9.

Figure 8:
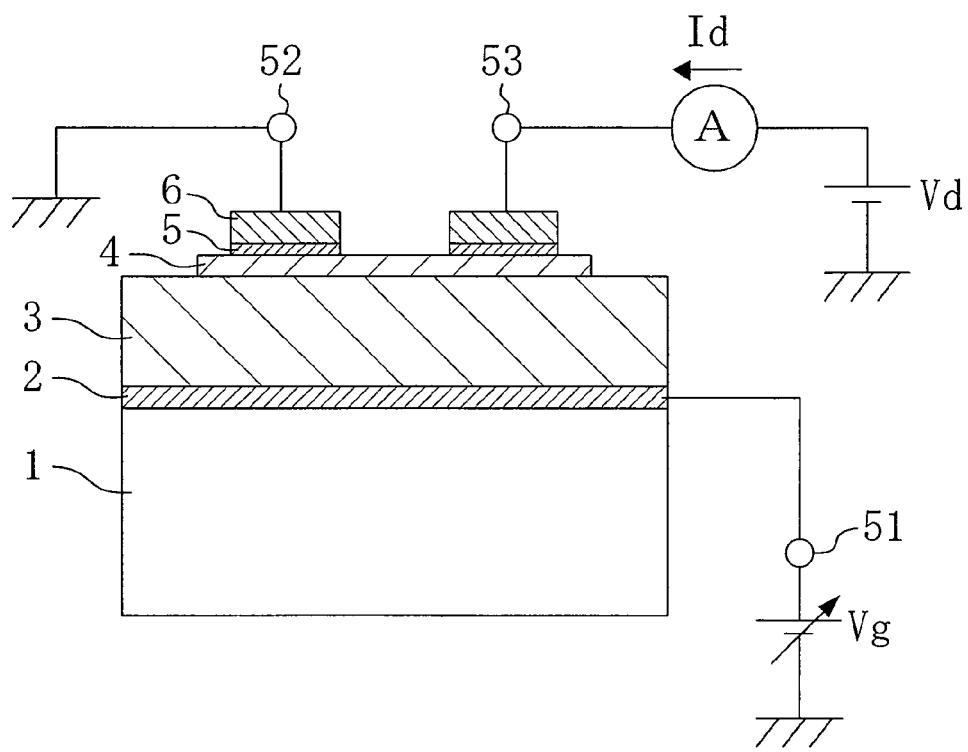
FIG. 8 is a view showing a structure of a circuit for measuring the subthreshold characteristic of the semiconductor memory device according to the first embodiment.
Figure 9:
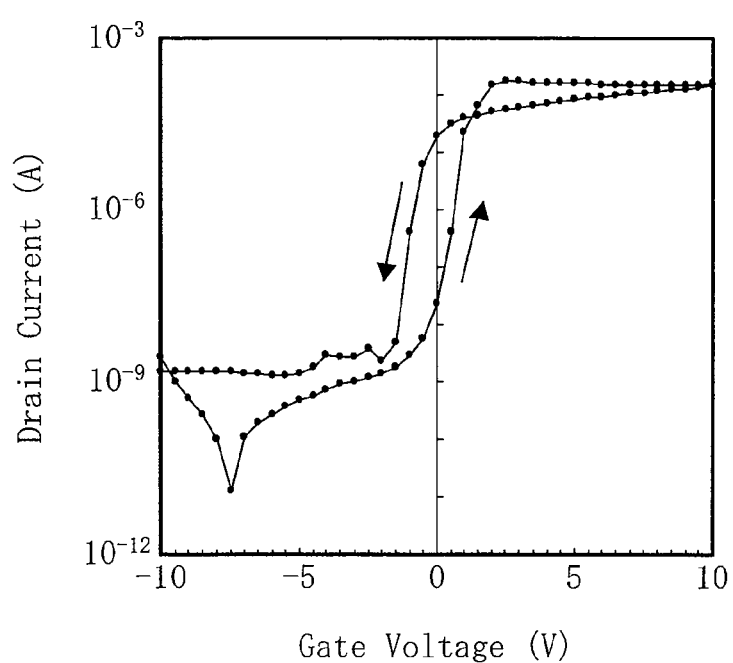
FIG. 9 is a graph showing the subthreshold characteristic of the semiconductor memory device according to the first embodiment.

As shown in FIG. 8, a drain current $I_d$ was measured by applying a gate voltage $V_g$ to the terminal 51 of the gate electrode 2, grounding the terminal 52 of the source electrode 5 or 6, and applying a drain voltage of $V_d=1$ V to the terminal 53 of the drain electrode 6 or 5. FIG. 9 is a graph showing the result of the measurement. The locus (hysteresis) exhibited by the drain current when $V_g$ was scanned from −10 V to +10V is different from that exhibited by the drain current when $V_g$ was scanned from +10 V to −10V. Each of the drain currents when $V_g=0$ V was satisfied was not more than 1 nA and not less than 1 µA, so that the obtained current ratio was not less than three orders of magnitude.

Figure 10A:
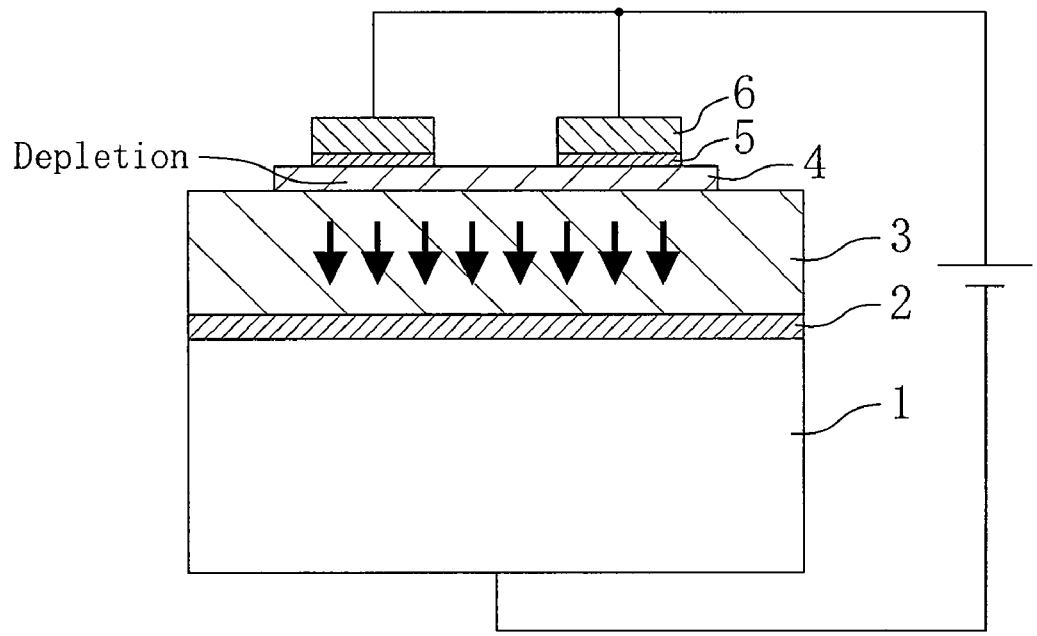
Figure 10B:
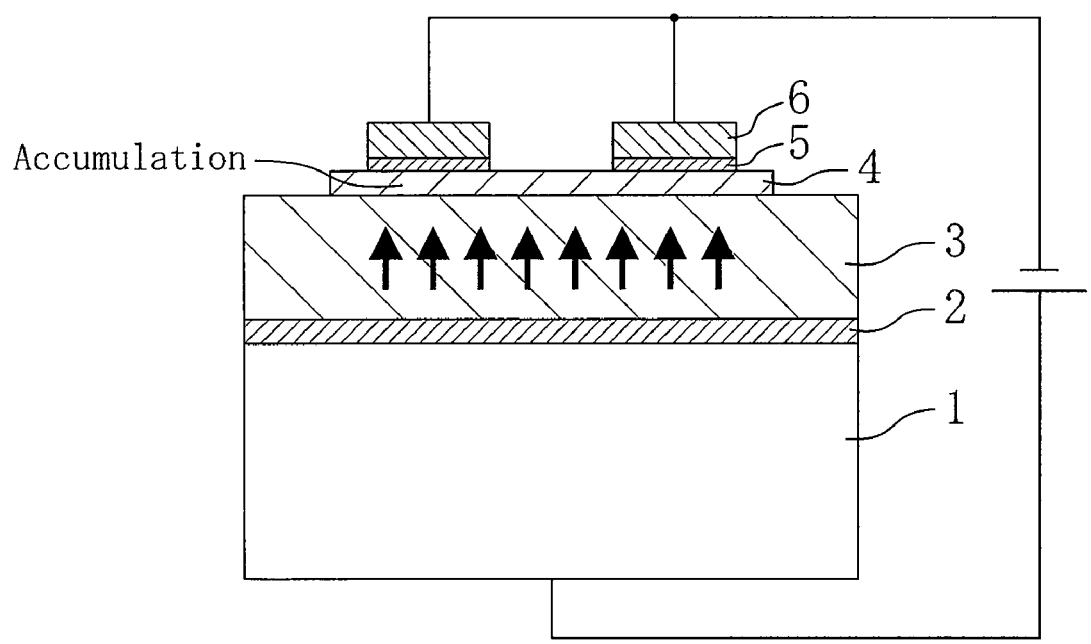

The reason for the difference in current value produced even in the state where the application of the voltage to the gate electrode 2 was cut off is that the depletion/accumulation of interface charges is held by the remanent polarization of the ferroelectric film 3. That is, when a negative voltage was applied to the gate electrode 2 as shown in FIG. 10A, the polarization of the ferroelectric film 3 was oriented downward to repel carriers away, so that the whole semiconductor film 4 (channel) was depleted and high in resistance. By contrast, when a positive voltage was applied to the gate electrode 2 as shown in FIG. 10B, the polarization of the ferroelectric film 3 was oriented upward to induce carriers at a concentration corresponding to the polarization density at the interface, so that the semiconductor film 4 was in a charge accumulation state and low in resistance.

The actual carrier concentration of the ZnO film measured by hole measurement was $4.7\times10^{18}\ cm^{-3}$ and, when the thickness of the ZnO film 4 was 30 nm, the surface charge density was $1.5\times10^{12}\ cm^{-2}$. Since the value is sufficiently small compared with the surface charge density ($2\times10^{14}\ cm^{-2}$) corresponding to the remanent polarization value of the PZT film, the ZnO film is completely depleted. By further associating the larger drain current value and the smaller drain current value with binary data "1" and "0", the memory function is implemented. Moreover, because the remanent polarization of the ferroelectric film is stored even in the sate where the voltage is cut off, a nonvolatile memory can be realized.

Figure 11:
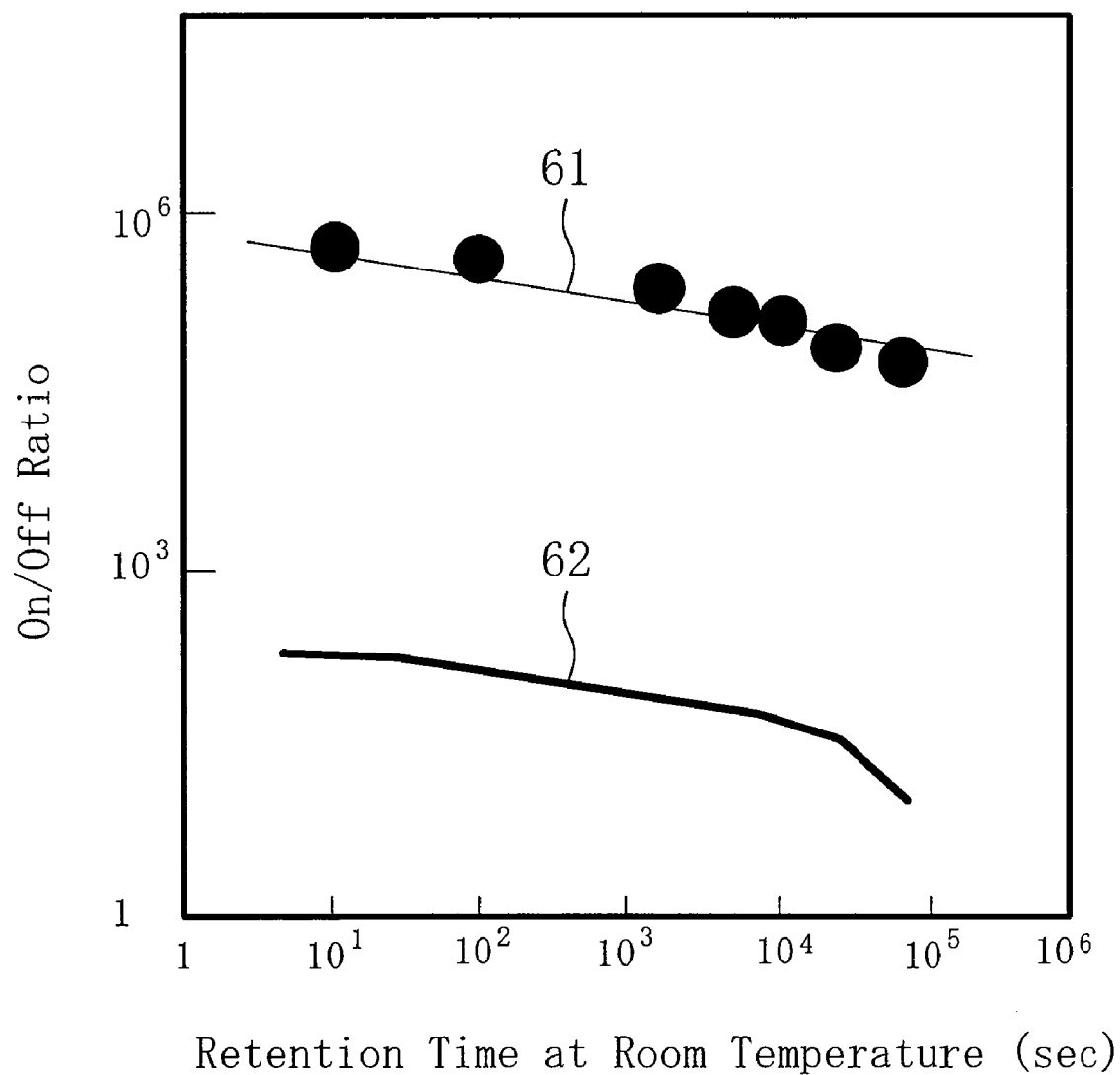
FIG. 11 is a graph showing the charge retention characteristic of the semiconductor memory device according to the first embodiment.

FIG. 11 is a graph showing the result of measuring the retention time of the On/Off ratio. The curve 61 shows the retention time in the semiconductor memory device according to the present embodiment, while the curve 62 shows the retention time in the conventional semiconductor memory device. On/Off ratios were measured by applying pulse voltages of +10 V and −10V each having a pulse width of 500 nanoseconds to the gate electrodes, subsequently applying a drain voltage of 0.1 V while keeping the gates in a zero-bias state, and measuring the drain currents. As shown by the curve 61 of FIG. 11, the On/Off ratio of not less than four orders of magnitude was maintained even after the semiconductor memory device according to the present embodiment was allowed to stand for 16 hours at a room temperature. From this, it can be seen that, compared with the conventional semiconductor memory device, the retention characteristic of the semiconductor memory device according to the present embodiment has been significantly improved.

Embodiment 2

In the first embodiment, the crystal orientation (the direction of spontaneous polarization) of the semiconductor film 4 is controlled by the crystal orientation of the ferroelectric film 3. However, to determine the crystal orientation of the ferroelectric film 3, it is necessary to use a substrate having a specified crystal structure and a specified crystal orientation. The second embodiment of the present invention provides a method for fabricating a semiconductor memory device comprising a semiconductor film having a crystal orientation thereof controlled in a predetermined direction without being restricted by the type of the substrate.

Figure 12A:
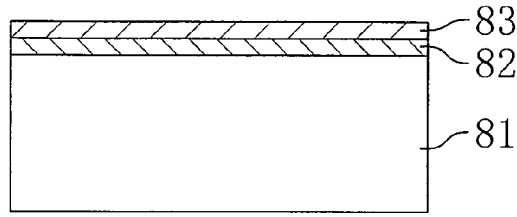
FIGS. 12A to 12F are cross-sectional views illustrating a method for fabricating a semiconductor memory device according to a second embodiment of the present invention.

FIGS. 12A to 13D are step cross-sectional views schematically illustrating the method for fabricating the semiconductor memory device according to the present embodiment;

First, as shown in FIG. 12A, a MgZnO film 82 having a thickness of 20 nm and a ZnO film 83 having a thickness of 30 nm are continuously grown by a PLD method on a ZnO substrate 81 cut out to have a (11-20) surface (non-polar surface) in the state where the substrate temperature is set at 800° C. The crystal growth of each of the films is controlled to be in the same direction as the orientation surface of the substrate 81.

Figure 12D:
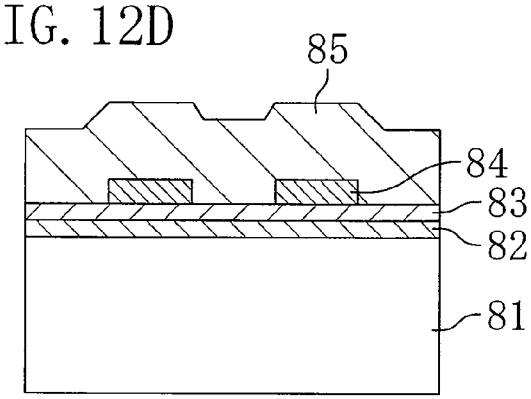
Figure 12B:
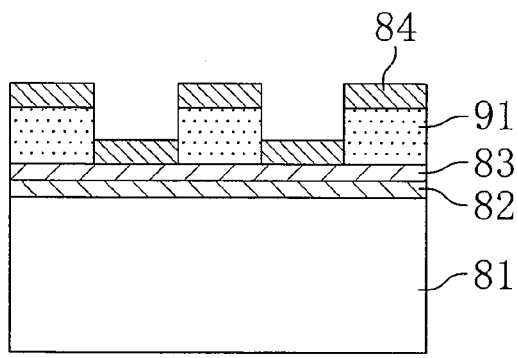

Next, as shown in FIG. 12B, a resist film 91 is patterned, and then a Pt film 84 having a thickness of 50 nm is formed by an electron beam vapor deposition method. Thereafter, the resist film 91 is removed so that source/drain electrodes 84 are formed at predetermined positions on the ZnO film 83, as shown in FIG. 12C.

Next, as shown in FIG. 12D, a PZT film 85 having a thickness of 450 nm is formed on the ZnO film 83 to cover the source/drain electrodes 84 at a substrate temperature of 630° C. without opening a PLD chamber to an atmosphere. The composition of a sintered body as the target of PLD is Pb:Zr: Ti=1:0.30:0.70. At the composition, PZT is completely composed of a tetragonal phase, and the lattice mismatch between the (1-102) surface of the ZnO film 83 and the (001) surface of the PZT film 85 is smaller than in the case where a sintered body having a composition ratio of Pb:Zr:Ti=1:0.52:0.48 is used as the target of PLD, so that surface states are reduced.

Figure 12E:
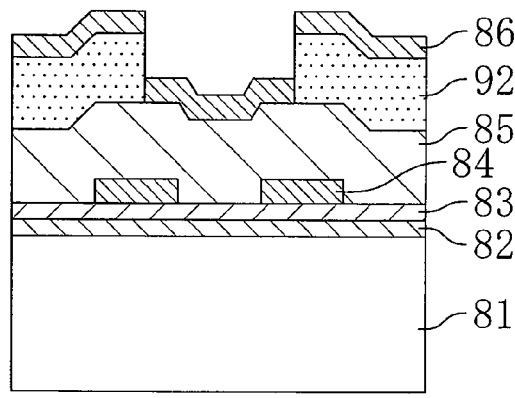
Figure 12C:
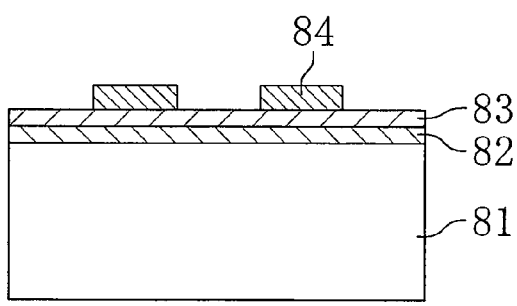
Figure 12F:
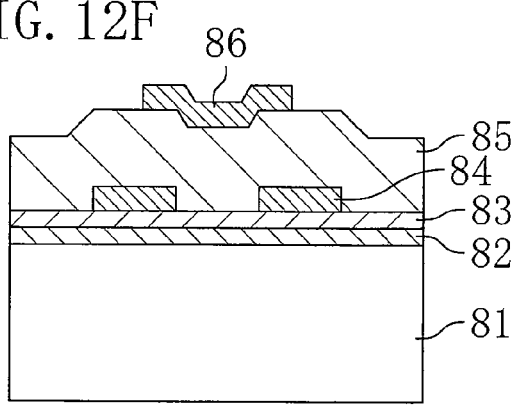

Next, as shown in FIG. 12E, the resist film 92 is patterned on the PZT film 85, and then a Pt film 86 having a thickness of 60 nm is formed by an electron beam vapor deposition method. Thereafter, the resist film 92 is removed so that a gate electrode 86 is formed at a predetermined position on the PZT film 85, as shown in FIG. 12F. The gate electrode 86 is formed to overlap a part of each of the source/drain electrodes 84.

Figure 13A:
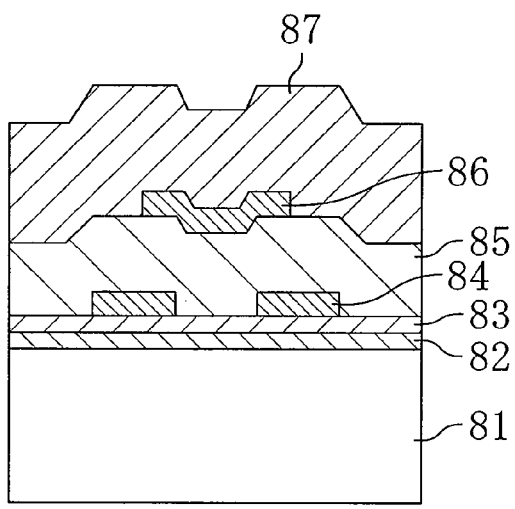
FIGS. 13A to 13D are cross-sectional views illustrating the method for fabricating the semiconductor memory device according to the second embodiment.
Figure 13B:
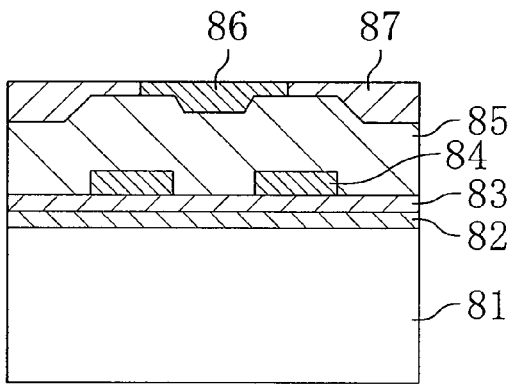

Next, as shown in FIG. 13A, an AlN film 87 serving as a protective film is deposited by 300 nm by using a sputtering method. Because the AlN film does not permit the transmission of hydrogen therethrough, it can prevent the degradation of the PZT film 85 and the ZnO film 83. Thereafter, as shown in FIG. 13B, the AlN film 87 is planarized by chemical mechanical polishing (CMP) till the gate electrode 86 is exposed.

Figure 13C:
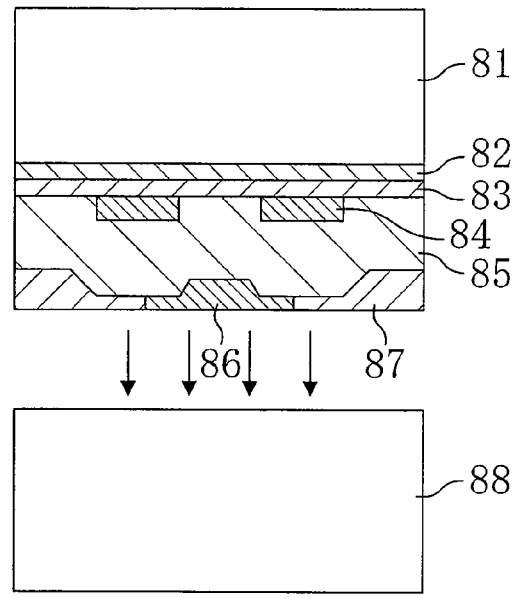

Next, as shown in FIG. 13C, a conductive supporting substrate 88 is bonded to the exposed surface of the gate electrode 86 using a wafer bonding system.

Figure 13D:
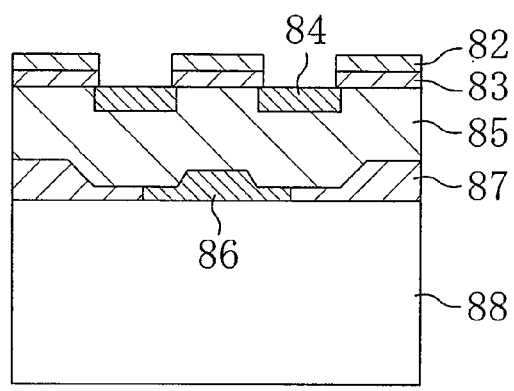
Figure 14A:
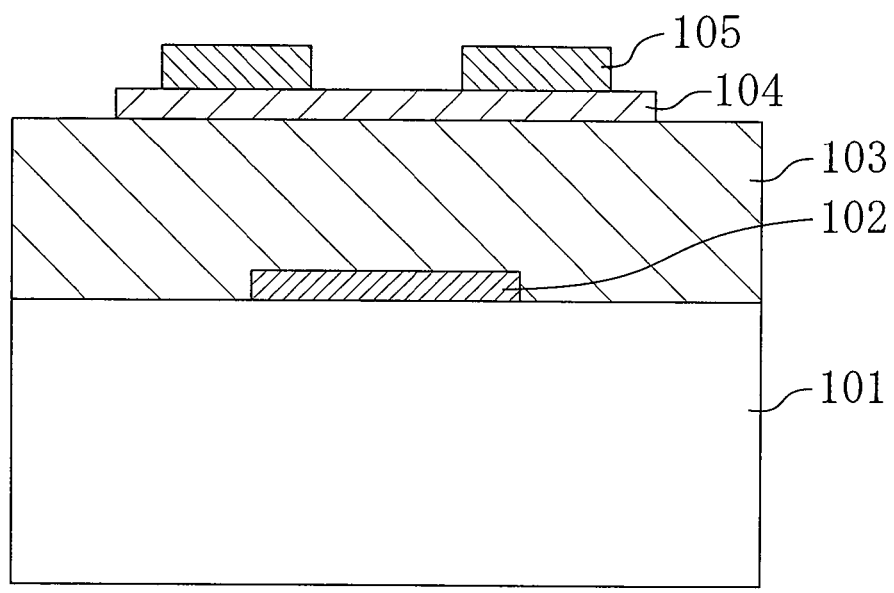
Figure 14B:
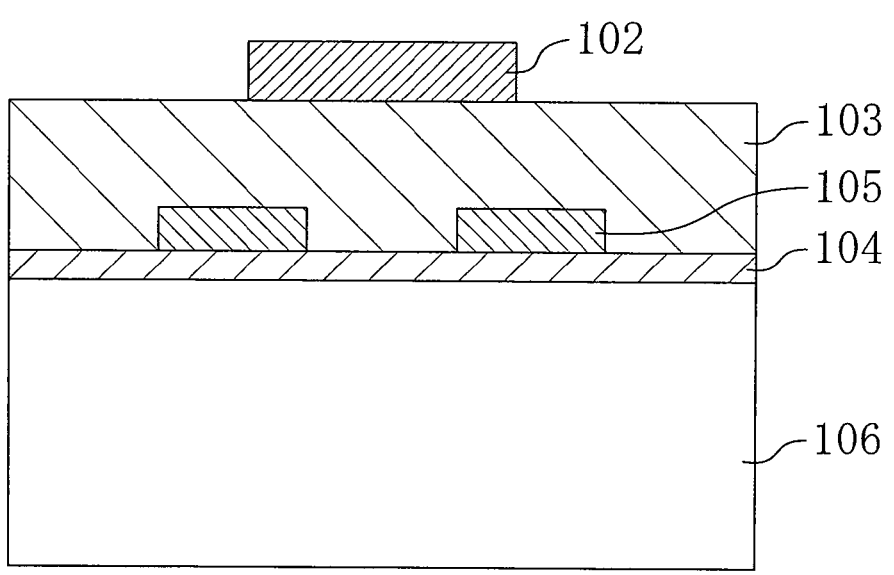
Figure 15:
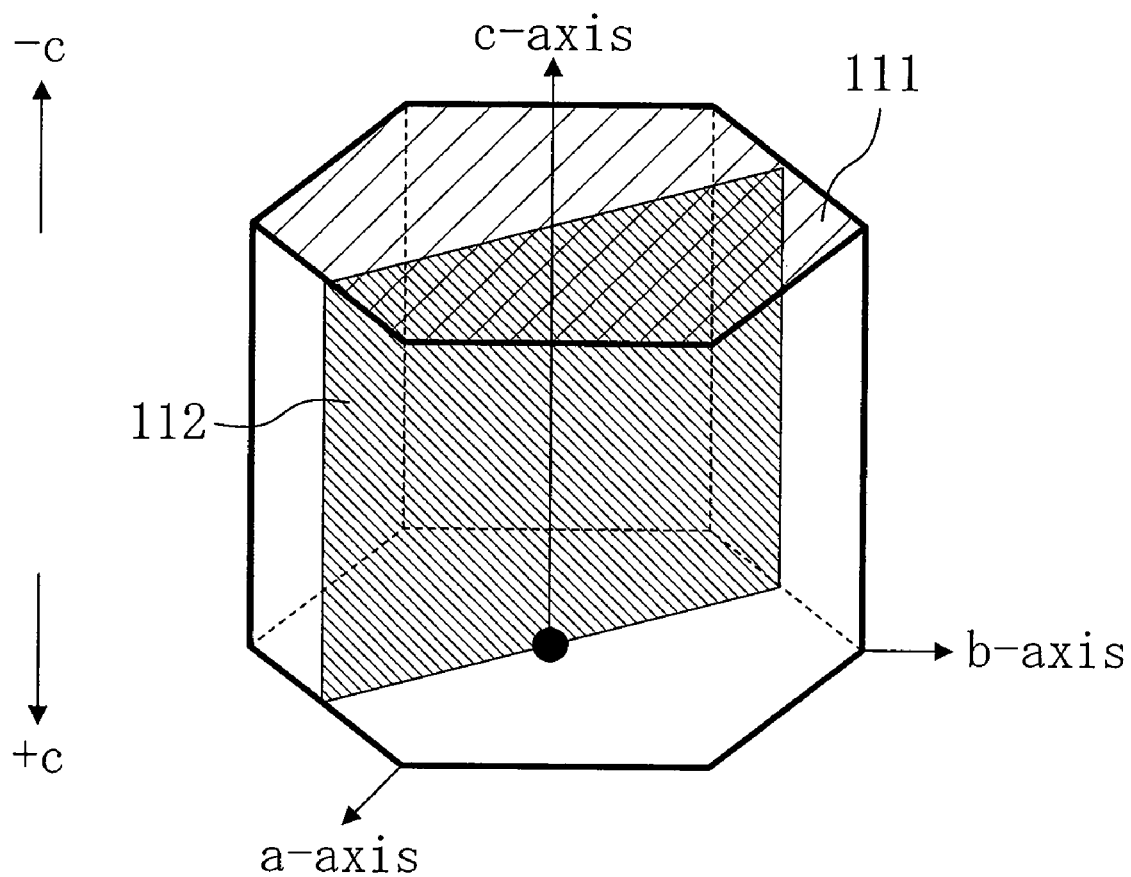
FIG. 15 is a view showing a conventional crystal structure of ZnO.
Figure 16:
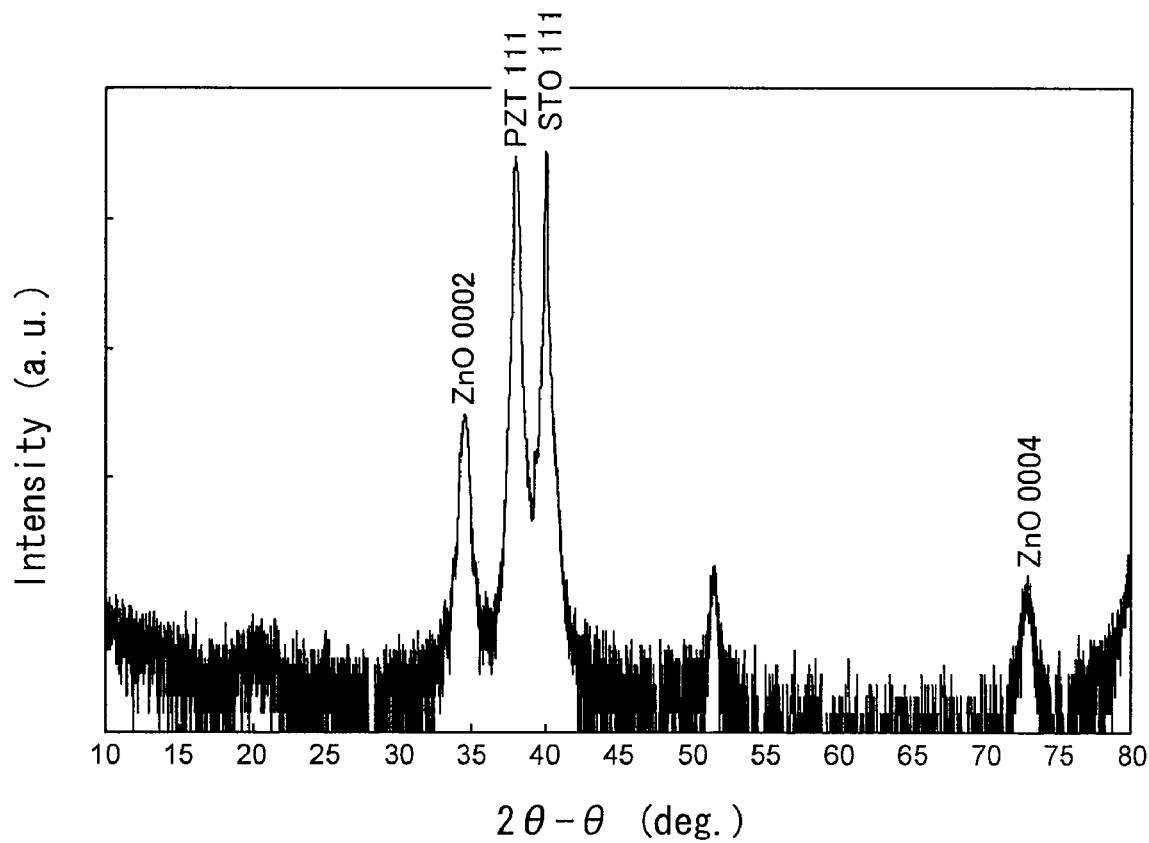
FIG. 16 is a view showing the X-ray diffraction pattern of a ZnO film formed on a conventional PZT film.

Finally, as shown in FIG. 13D, the ZnO substrate 81 is scraped down till the MgZnO film 82 is reached and, by further etching a part of each of the MgZnO film 82 and the ZnO film 83, contact windows reaching the source/drain electrodes 84 are formed.

By using such a method, the supporting substrate 88 can be freely selected. Since wafer bonding is used, even when a memory portion is formed directly on a CMOS, the degradation of the CMOS due to a heat budget does not occur. As a result, it becomes possible to embed the memory even in a miniaturized process node of not more than 65 nm which uses nickel silicide as the silicide material of a CMOS contact portion. In addition, the MgZnO film 62 serves as a stopper when the substrate 81 is removed and also as an electron barrier layer with respect to the ZnO film 83. As a result, when the channel (ZnO film 83) is composed of a thin film having a thickness of not more than 30 nm, the effect of confining electrons within the channel can be expected, and therefore a loss in the current flowing in the channel can be suppressed.

The supporting board 88 may also be an insulating substrate made of glass, a plastic material, or the like as long as the gate electrode 86 can be connected to a driving circuit. Alternatively, the supporting board 88 may also be a substrate formed with a CMOS. This allows the realization of a merged logic/memory configuration.

As the substrate 81, it is also possible to use a ScAlMgO$_4$ (SCAM) substrate, a SiC substrate, or a sapphire substrate cut out to have a non-polar surface, such as a (11-20) surface or a (1-100) surface.

Although the present invention has been described thus far by using the preferred embodiments thereof, it will easily be appreciated that the description is not restrictive and various changes and modifications can be made to the present invention.

What is claimed is:

1. A semiconductor memory device comprising a field effect transistor using an interface between a ferroelectric film and a semiconductor film as a channel, wherein the field effect transistor comprises:

a gate electrode to which a voltage for controlling a polarization state of the ferroelectric film is applied; and source/drain electrodes provided on both ends of the channel to detect a current flowing in the channel in accordance with the polarization state, wherein the semiconductor film is made of a material having a spontaneous polarization and a direction of the spontaneous polarization is parallel with the interface between the ferroelectric film and the semiconductor film.

2. The semiconductor memory device of claim 1, wherein the semiconductor film is formed on the ferroelectric film by epitaxial growth and the direction of the spontaneous polarization is controlled by a crystal orientation of the ferroelectric film.

3. The semiconductor memory device of claim 1, wherein the semiconductor film has a wurtzite-type crystal structure and a <11-20> direction or a <1-100> direction thereof is perpendicular to a principal surface of the semiconductor film.

4. The semiconductor memory device of claim 3, wherein the semiconductor film is made of ZnO, GaN, InN, or InGaN.

5. The semiconductor memory device of claim 1, wherein the semiconductor film has a thickness of not more than 60 nm.

6. The semiconductor memory device of claim 5, wherein the semiconductor film has a carrier concentration of not more than $1 \times 10^{17}$ cm$^{-3}$.

7. The semiconductor memory device of claim 2, wherein the ferroelectric film is made of lead zirconium titanate $(Pb(Zr_{1-x}Ti_x)O_3$ $(0 \leqq x \leqq 1)$ having a tetragonal crystal structure and a <001> direction thereof is perpendicular to a principal surface of the ferroelectric film.

8. The semiconductor memory device of claim 7, wherein a <100> direction in a plane of the ferroelectric film coincides with a <1-102> direction in a plane of the semiconductor film.

9. The semiconductor memory device of claim 2, wherein the ferroelectric film is made of lead zirconium titanate $(Pb(Zr_{1-x}Ti_x)O_3$ $(0 \leqq x \leqq 1)$ having a rhombohedral crystal structure and a <100> direction thereof is perpendicular to a principal surface of the ferroelectric film.

10. The semiconductor memory device of claim 9, wherein a <001> direction in a plane of the ferroelectric film coincides with a <1-102> direction in a plane of the semiconductor film.

11. A method for fabricating the semiconductor memory device of claim 1, the method comprising the steps of:

forming the gate electrode on a substrate;

continuously forming the ferroelectric film and the semiconductor film on the substrate to cover the gate electrode; and forming the source/drain electrodes on a surface of the semiconductor film, wherein the direction of spontaneous polarization of the semiconductor film is controlled by crystal orientation of the ferroelectric film.

12. The method for fabricating the semiconductor memory device of claim 11, wherein the semiconductor film is formed on the ferroelectric film by epitaxial growth.

13. A method for fabricating the semiconductor memory device of claim 1, the method comprising the steps of:

preparing a substrate cut out to have a non-polar surface as a surface thereof;

forming the semiconductor film on the substrate by epitaxial growth;

forming the source/drain electrodes on the semiconductor film;

forming the ferroelectric film on the semiconductor film to cover the source/drain electrodes;

forming the gate electrode on the ferroelectric film;

forming an insulating film on the ferroelectric film to cover the gate electrode;

planarizing the insulating film till a surface of the gate electrode is exposed;

bonding the planarized surface to a supporting substrate; and removing the substrate till the semiconductor film is exposed.

14. The method for fabricating the semiconductor memory device of claim 13, wherein the substrate is made of the same material as that of the semiconductor film.

* * * * *